(12) United States Patent
Banba et al.

(10) Patent No.: US 6,207,356 B1
(45) Date of Patent: Mar. 27, 2001

(54) METHOD FOR THE PATTERN-PROCESSING OF PHOTOSENSITIVE RESIN COMPOSITION

(75) Inventors: Toshio Banba; Toshiro Takeda, both of Utsunomiya (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 09/287,118

(22) Filed: Apr. 7, 1999

Related U.S. Application Data

(63) Continuation-in-part of application No. 08/775,721, filed on Dec. 31, 1996, now abandoned.

(51) Int. Cl.$^7$ .............................. G03F 7/30; G03F 7/023
(52) U.S. Cl. ........................ 430/326; 430/192; 430/331
(58) Field of Search ................................. 430/326, 192, 430/331

(56) References Cited

U.S. PATENT DOCUMENTS

| 3,669,658 | 6/1972 | Yokazawa et al. | 430/192 |
| 4,959,296 | 9/1990 | Yoshida et al. | 430/302 |
| 5,106,724 | 4/1992 | Nogami et al. | 430/331 |
| 5,240,819 | 8/1993 | Mueller et al. | 430/326 |
| 5,449,584 * | 9/1995 | Banba et al. | 430/190 |

FOREIGN PATENT DOCUMENTS

| 0 291 779 | 11/1988 | (EP) . |
| 0 413 559 | 2/1991 | (EP) . |
| 0 459 395 | 12/1991 | (EP) . |
| 0 493 923 | 7/1992 | (EP) . |
| 64-60630 | 3/1989 | (JP) . |
| 1-46862 | 10/1989 | (JP) . |
| 08123034 | 5/1996 | (JP) . |

* cited by examiner

*Primary Examiner*—John S. Chu
(74) *Attorney, Agent, or Firm*—Browdy And Neimark

(57) ABSTRACT

A method of pattern-processing a photosensitive resin composition which comprises coating on a substrate a positive photosensitive resin composition of a polyamide of formula (1) below and a diazoquinone compound, subjecting the same to prebaking and then to irradiation with light, thereafter dissolving the exposed portion in an alkaline aqueous solution containing an alkylbenzenesulfonic acid to remove the same, thereby obtaining a pattern.

(1)

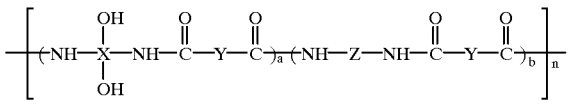

wherein X is a tetravalent aromatic group; Y is a divalent aromatic group; Z is

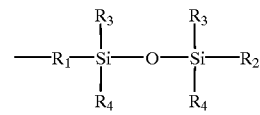

in which $R_1$ and $R_2$ are divalent organic groups and $R_3$ and $R_4$ are nonvalent organic groups; a and b are mole fractions; a+b=100 mole %; a=60.0–100 mole %; b=0–40.0 mole % and n=2–500. When the development is effected with the alkaline aqueous solution containing the alkylbenzenesulfonic acid, a scum-free, very high resolution pattern is obtained.

13 Claims, No Drawings

METHOD FOR THE PATTERN-PROCESSING OF PHOTOSENSITIVE RESIN COMPOSITION

CROSS-REFERENCE TO RELATED APPLICATIONS

This is a CIP of parent application Ser. No. 08/775,721, filed Dec. 31, 1996, now abandoned, the contents of which are hereby incorporated by reference.

BACKGROUND OF THE INVENTION

1. Field of the Invention

This invention relates to a method for the pattern-processing of a photosensitive resin composition for obtaining a scum-free, high-resolution pattern.

2. Prior Art

In a semiconductor industry, a photosensitive resin such as a photoresist, a photosensitive polyimide or the like has recently been often used in the preparation of a very fine circuit such as IC, LSI or the like or as an insulating film or protective film in a package requiring processing. The characteristic feature of the photosensitive resin consists in that a high precision resin pattern can be obtained by a relatively simple apparatus. In particular, a positive photoresist comprising as a base a phenol novolak resin using a diazoquinone or the like as a photosensitive agent enables the formation of a pattern excellent in resolution because it does not swell during developing. In addition, since the developer is an alkaline aqueous solution, the positive photoresist is excellent in an aspect of safety. As discussed above, the photosensitive resin has many features, and hence, has been often used in the production of fine circuits and the like of the above semiconductor. On the other hand, in a photosensitive, heat-resistant resin such as a photosensitive polyimide which is used in the insulating film or protective film of a semiconductor, a positive type photosensitive, heat resistant resin having such features as high resolution, environmental pollution-free developer and the like has been developed similarly to the photoresist (see, for example, JP-A-64-60630, JP-B-1-46862 and the like) and has attracted attention as a resin for insulating film or protective film of a highly integrated semiconductor.

Most of the positive photosensitive resin compositions are composed of a combination of an alkali soluble polymer with the above-mentioned diazoquinone compound as a photosensitive agent. In the unexposed portions, these quinonediazide compounds are insoluble in an alkaline aqueous solution; however, upon exposure, they cause a chemical reaction to become soluble in an alkaline aqueous solution. Accordingly, utilizing the difference in solubility between the exposed portion and the unexposed portion, the exposed portion is removed by an alkaline aqueous solution, whereby it becomes possible to prepare a coating film pattern composed of only the unexposed portion.

The alkaline aqueous solution used as a developer is generally an aqueous solution of tetramethylammonium hydroxide (referred to hereinafter as TMAH). When a photoresist comprising as a base a conventional phenol novolak resin is developed, a good development can be effected using an aqueous solution of this TMAH. However, in the case of a photosensitive resin composition comprising a polybenzoxazole precursor as stated in JP-B-1-46862 as a base, there is such a disadvantage that an undeveloped portion (scum) remains in the exposed portion which should be completely removed to avoid deterioration of the resolution.

SUMMARY OF THE INVENTION

An object of this invention is to provide a method for the pattern-processing of a photosensitive resin composition giving a high resolution without causing a scum which has been caused in the conventional pattern processing.

Other objects and advantages of this invention will become apparent from the following description.

According to this invention, there is provided a method for the pattern-processing of a photosensitive resin composition, which comprises coating a positive photosensitive resin composition comprising a polyamide represented by the following formula (1) and a diazoquinone compound on a substrate, subjecting the same to prebaking and then to irradiation with a light and thereafter dissolving the exposed portions in an alkaline aqueous solution containing an alkylbenzenesulfonic acid to remove the same, thereby obtaining a pattern:

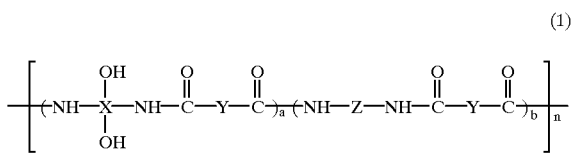

(1)

wherein X is a tetravalent aromatic group; Y is a divalent aromatic group; Z is

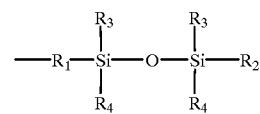

in which $R_1$ and $R_2$ are divalent organic groups and $R_3$ and $R_4$ are monovalent organic groups; a and b are mole fractions; a+b=100 mole %; a=60.0–100 mole %; b=0–40.0 mole % and n=2–500.

DETAILED DESCRIPTION OF THE INVENTION

The polyamide represented by the formula (1) is composed of a bisaminophenol having the structure of X and a dicarboxylic acid having the structure of Y and when this polyamide is heated at about 300–400° C., ring closure reaction is caused to convert the polyamide to a heat-resistant resin called polybenzoxazole. In general, a positive photosensitive resin composition is developed with an aqueous alkali solution. For example, a photoresist can be developed because the phenol novolak resin which is the base of the photoresist has phenolic hydroxyl groups. Similarly, a positive photosensitive resin comprising as a base a polyamide represented by the formula (1) can also be developed because the bisaminophenol having the structure of X has phenolic hydroxyl groups. However, this photosensitive resin is inferior in developability to the photoresist comprising as the base a phenol novolak resin and causes scum in the exposed portion, whereby the resolution is deteriorated.

This is considered to be because while the phenol novolak resin contains one hydroxyl group per one benzene ring, the polyamide represented by the formula (1) contains a hydroxyl group only in the amine moiety. In the case of a polyamide formed by replacing a part of the bisaminophenol having the structure of X by the silicone diamine having the structure of Z of the formula (1) for the purpose of improving the adhesiveness, the solubility of the resin becomes lower, and hence, more scum is caused and the resolution becomes very bad. However, when the resin composition is processed with the aqueous alkali solution containing an alkylbenzene-sulfonic acid of this invention, the scum is not caused at all. Although the cause has not been clarified, this is considered to be because the affinity between the resin and the developer is improved by the alkylbenzene-sulfonic acid.

In the polyamide (1) of this invention, X includes, for example,

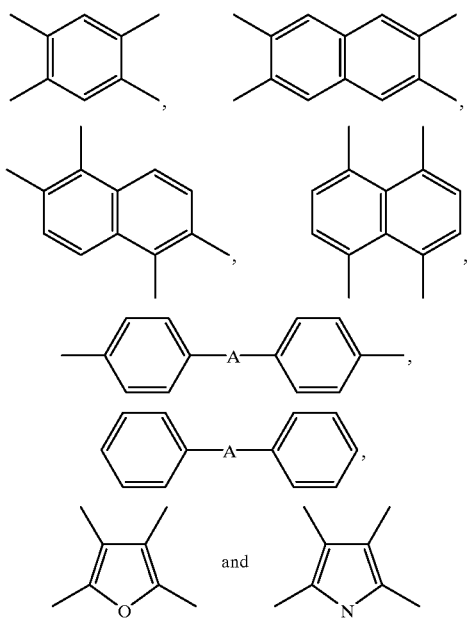

wherein A represents —$CH_2$—, —O—, —S—, —$SO_2$—, —CO—, —NHCO— or —$C(CF_3)_2$—; and the like, but is not limited thereto.

In the formula (1), Y includes, for example,

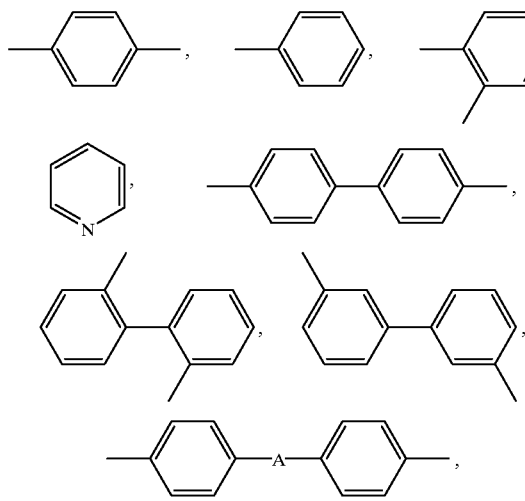

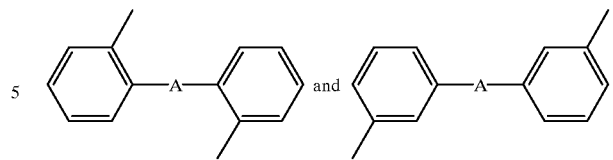

wherein A represents —$CH_2$—, —O—, —S—, —$SO_2$—, —CO—, —NHCO— or —$C(CF_3)_2$—; and the like, but is not limited thereto.

Moreover, in the formula (1), Z includes, for example,

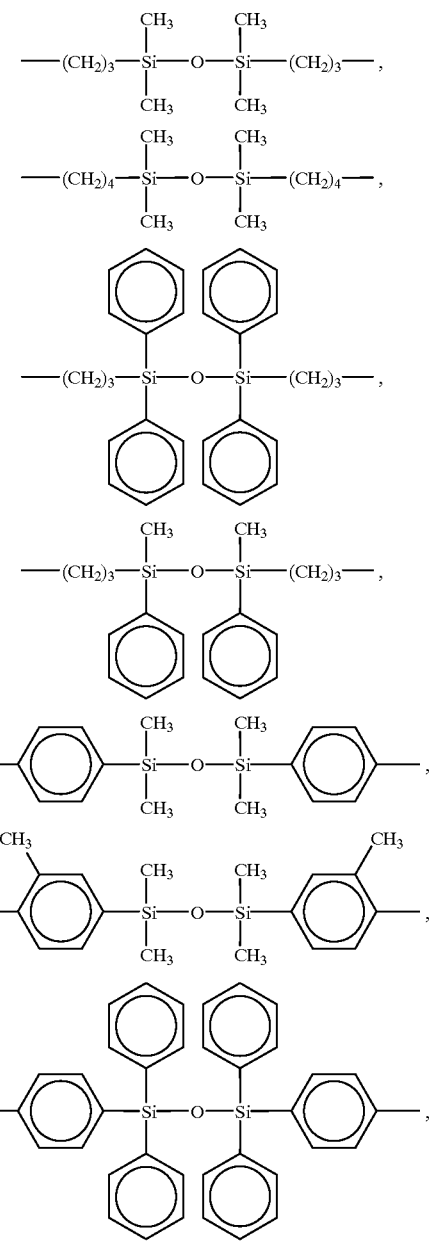

and the like, but is not limited thereto.

Z in the formula (1) is used when the adhesiveness to a substrate such as a silicon wafer is required, and can be used in such an amount that the proportion b is at most 40.0 mole %. When the proportion b exceeds 40 mole %, the solubility of the resin becomes very low and even when the pattern-processing method of this invention is used scum is caused and the pattern-processing becomes impossible.

Incidentally, when these X, Y and Z are used, each of them may be alone or in admixture of two or more.

The surfactant used in this invention is an alkylbenzene-sulfonic acid. Dodecylbenzenesulfonic acid is a typical example. However, the surfactant is not limited thereto. The surfactants containing a salt such as alkylbenzenesulfonic acid salt and the like contain undesirably large amounts of metallic impurities, and such impurities cause a corrosion of the aluminum pad of the semi-conductor, etc. and hence such salts are not preferable. The content of metal ion in the whole alkaline aqueous solution should be kept to no more than 0.001 to 1 ppm, and when the content exceeds 1 ppm, corrosion of semi-conductor chip, etc. occurs. Therefore, an alkylbenzenesulfonic acid is preferred as a surfactant.

The amount of the alkylbenzenesulfonic acid contained in the alkaline aqueous solution which is the developer of this invention is preferably 0.1 to 10% by weight based on the total weight of the alkaline aqueous solution. When the amount is less than 0.1% by weight, scum tends to be caused and when the amount is more than 10% by weight, the film thickness loss in the unexposed portion becomes large and no good pattern is obtained.

The alkaline aqueous solution of this invention is for dissolving and removing the alkali-soluble polymer and must be an aqueous solution having dissolved therein an alkali compound. The alkali compound includes, for example, primary amines such as ethylamine, n-propylamine and the like; secondary amines such as diethylamine, di-n-propylamine and the like; tertiary amines such as triethylamine, methyldiethylamine and the like; alcoholamines such as dimethylethanolamine, triethanolamine and the like; and quaternary ammonium salts such as tetramethylammonium hydroxide, tetraethylammonium hydroxide and the like. These may be used alone or in admixture of two or more. Among them, tetramethyl-ammonium hydroxide is preferable. Inorganic alkalis are not preferred. The concentration of the alkali compound is 0.1 to 10% by weight, preferably 1 to 3% by weight.

The photosensitive resin composition used in this invention comprises a polyamide, a diazoquinone compound and a solvent as the main components, and may, if necessary, contain a polyamic acid. The polyamic acid has a carboxyl group, so that the solubility is increased and the developing time can be shortened.

The diazoquinone compound used in this invention is a compound having a 1,2-benzoquinonediazide or 1,2-naphthoquinone-diazide structure and is a known compound as disclosed in U.S. Pat. Nos. 2,772,972; 2,797,213; and 3,669,658. It includes, for example, compounds represented by the following structural formulas:

(a)

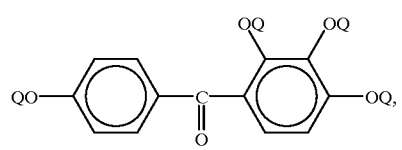

-continued (b)

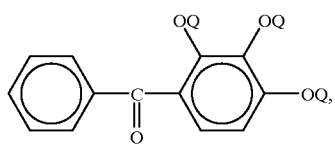

(c)

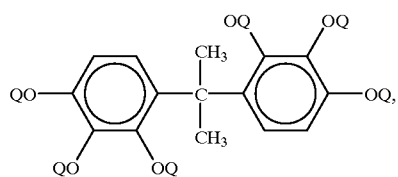

(d)

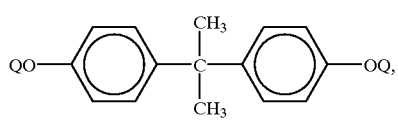

(e)

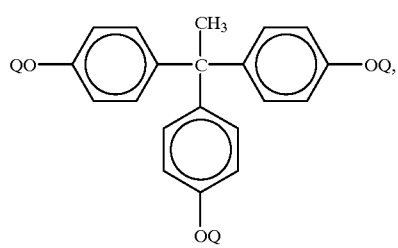

(f)

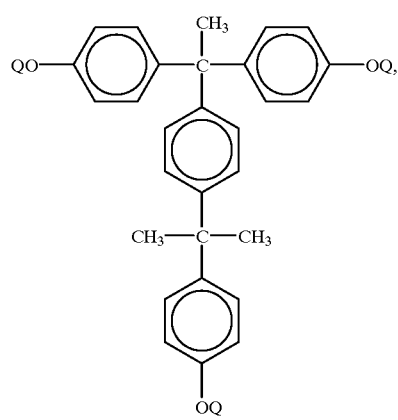

(g)

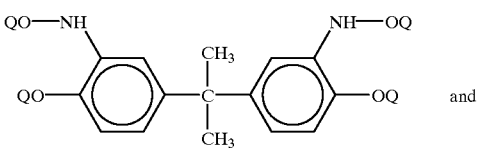 and (h)

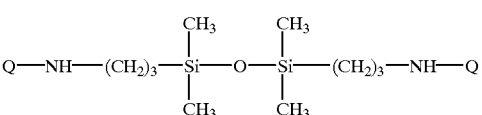

wherein Q is a hydrogen atom,

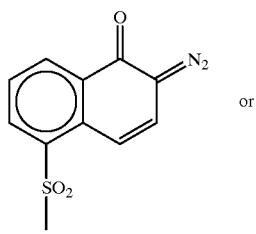

or

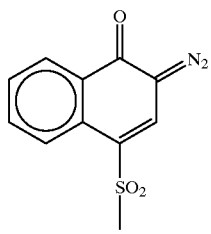

and at least one Q in each compound is

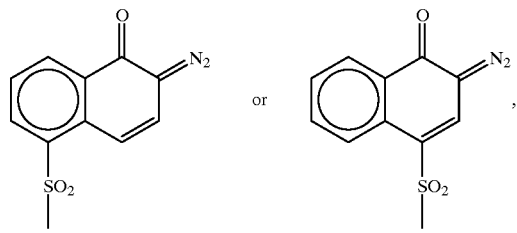

and the like.

Among the above compounds, preferable are (d), (e), (f) and (g), and (f) is particularly preferable.

The method of preparing a pattern comprises coating the composition on a suitable support, for example, a silicon wafer, a ceramic substrate, an aluminum substrate or the like. The coating can be carrier out by, for example, spin coating using a spinner, spray coating using a spray coater, immersion, printing, roll coating or the like. Subsequently, the coating film is dried at a temperature of about 60–180° C. for a period of 1 to 10 minutes. The drying method is carried out using an oven, an infrared dryer, a hot plate or the like, and the hot plate is preferred in view of efficiency and easy temperature control. When this hot plate is used, the drying is preferably effected at a temperature of 80 to 130° C. When the temperature is lower than 80° C., the drying becomes insufficient and this is not desirable. When the temperature exceeds 130° C., the drying becomes excessive and this is not desirable. The drying is more preferably effected at a temperature of 100° to 120° C. for a period of 2 to 4 minutes.

Subsequently, the dried coating film is irradiated with chemical beams in the desired pattern form. As the chemical beams, there can be used X rays, electron beams, ultraviolet rays, visible lights and the like, and those having a wavelength of 200 to 500 nm are particularly preferable. In order to obtain a higher resolution pattern, an i-line stepper utilizing a wavelength of 365 nm or a g-line stepper utilizing a wavelength of 436 nm are more preferably used.

DESCRIPTION OF THE PREFERRED EMBODIMENTS

Examples are shown below to specifically explain this invention.

EXAMPLE 1

Synthesis of polyamide

In 150 parts by weight of N,N-dimethylacetamide and 33.2 parts by weight (0.42 mole) of pyridine was dissolved 33.6 parts by weight (0.1 mole) of hexafluoro-2,2-bis(3-amino-4-hydroxyphenyl)propane.

Subsequently, 21.3 parts by weight (0.105 mole) of terephthaloyl chloride dissolved in 100 parts by weight of cyclohexanone was dropped into the above solution at a temperature of –10° to –15° C. over 30 minutes, after which the solution was stirred at room temperature for 4 hours to complete the reaction. The reaction mixture was filtered and then the filtrate was poured into water to precipitate the objective polymer (A) represented by the following formula (A). The precipitates were collected by filtration, sufficiently washed with water and then dried at 80° C. in a vacuum for a whole day and night.

(A)

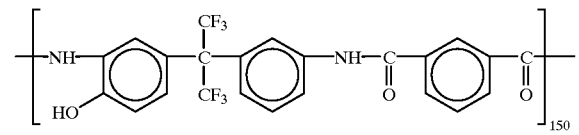

Preparation of a photosensitive resin composition

In 200 parts by weight of N-methyl-2-pyrrolidone (referred to hereinafter as NMP) were dissolved 100 parts by weight of the synthesized polyamide (A) and 25 parts by weight of a diazoquinone compound (D) represented by the following structural formula (D), and thereafter, the resulting solution was filtered through a Teflon filter of 0.2 μm to obtain a photosensitive resin composition:

(D)

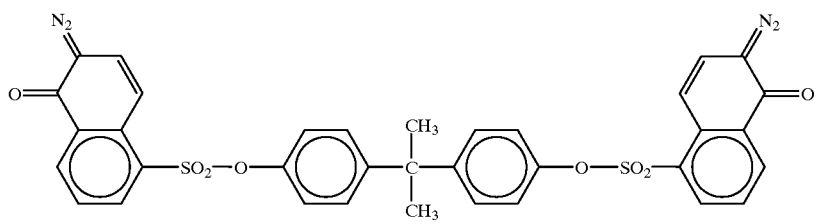

Evaluation of photosensitivity

This photosensitive resin composition was spin coated on a silicon wafer and heated on a hot plate at 120° C. for 3 minutes to evaporate the solvent, thereby forming a coating film having a thickness of 5 μm. This coating film was irradiated through a mask (test chart No. 1, a left pattern and a removed pattern were drawn in a width of 50–0.88 μm) manufactured by TOPPAN PRINTING CO., LTD. with ultraviolet rays from a high pressure mercury vapor lamp at a rate of 200 mJ/cm². The coating film obtained was developed with a developer consisting of 1.20 parts by weight of tetramethylammonium hydroxide, 98.30 parts by weight of pure water and 0.50 part by weight of dodecylbenzene-sulfonic acid for 30 seconds by a paddle method, to dissolve and remove the coating film in the exposed portion, and then, the developer was washed off with water for 10 seconds. As a result, a scum-free pattern having a line width of 2.5 μm was obtained.

The film thickness loss during the development [(reduction in thickness due to development/thickness before development)×100 (%), the smaller this value, the better] was 10% and good.

EXAMPLE 2

Synthesis of polyamide

In 150 parts by weight of N,N-dimethylacetamide were dissolved 33.0 parts by weight (0.090 mole) of hexa-fluoro-2,2-bis(3-amino-4-hydroxyphenyl)propane and 2.5 parts by weight (0.010 mole) of 1,3-bis(3-aminopropyl)-1,1,3,3-tetramethyl-disiloxane.

Subsequently, 21.3 parts by weight (0.105 mole) of terephthaloyl chloride dissolved in 100 parts by weight of cyclohexanone was dropped into the solution at a temperature of −10° to −15° C. over 30 minutes, and the resulting mixture was then stirred at room temperature for 4 hours to complete the reaction. The reaction mixture was filtered and thereafter the solution was poured into water to precipitate the objective polymer (B) represented by the following formula (B). The precipitates were collected by filtration, sufficiently washed with water and then dried at 80° C. in a vacuum for a whole day and night.

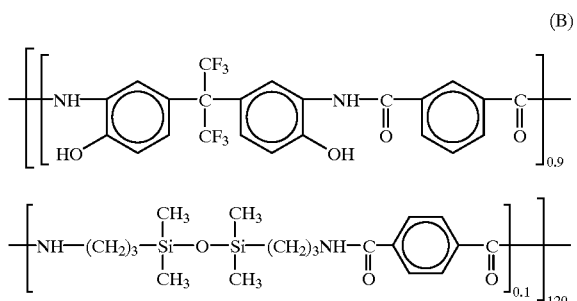

Preparation of a photosensitive resin composition

In 200 parts by weight of NMP were dissolved 100 parts by weight of the synthesized polyamide (B) and 25 parts by weight of the same diazoquinone compound (D) as used in Example 1, and thereafter, the resulting solution was filtered through a Teflon filter of 0.2 μm to obtain a photosensitive resin composition.

Evaluation of photosensitivity

Under the same conditions as in Example 1, spin coating, prebaking and exposure were conducted. Thereafter, development was effected with a developer consisting of 1.20 parts by weight of tetramethylammonium hydroxide, 93.80 parts by weight of pure water and 5 parts by weight of dodecylbenzene-sulfonic acid for 60 seconds by a paddle method to dissolve and remove the coating film in the exposed portion and then the developer was washed off with water for 10 seconds. As a result, a scum-free pattern having a line width of 5 μm was obtained. The film thickness loss at this time was 8% and good.

EXAMPLE 3

Synthesis of polyamide

In 400 parts by weight of NMP were dissolved 43.6 parts by weight (0.175 mole) of 1,3-bis(γ-aminopropyl)-1,1,3,3-tetramethyldisiloxane and 57.5 parts by weight (0.178 mole) of benzophenonetetracarboxylic acid dianhydride and the resulting solution was then stirred at room temperature for 7 hours. The reaction mixture was poured into water and the resulting precipitates were collected by filtration and then vacuum-dried at 80° C. to obtain a polyamic acid (C) represented by the following structural formula (C):

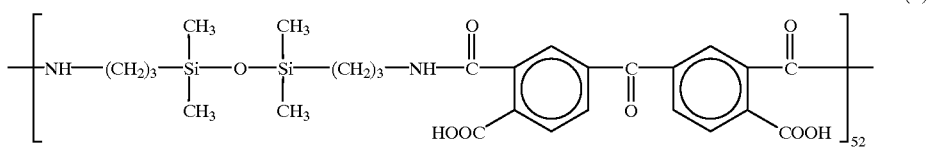

Preparation of photosensitive resin composition

To 80 parts by weight of the polyamide (A) obtained in Example 1 and 20 parts by weight of the polyamic acid (C) was added 30 parts by weight of the same diazoquinone compound (D) as used in Example 1 to make a solution and the solution was filtered through a Teflon filter of 0.2 μm to obtain a photosensitive resin composition.

Evaluation of photosensitivity

Under the same conditions as in Example 1, the spin coating, prebaking and exposure were carried out, and thereafter, development was conducted with a developer consisting of 1.20 parts by weight of tetramethylammonium hydroxide, 98.50 parts by weight of pure water and 0.30 part by weight of dodecylbenzene-sulfonic acid for 20 seconds by a paddle method to dissolve and remove the coating film in the exposed portion, after which the developer was washed off with water for 10 seconds. As a result, a scum-free pattern having a line width of 2 μm was obtained.

The film thickness loss at this time was 13% and good.

EXAMPLE 4

In the same manner as in Example 1, except that a diazoquinone compound (E) represented by the following structural formula (E) was substituted for the diazoquinone compound (D), evaluation was conducted, to obtain a scum-free pattern having a line width of 3 μm. The film thickness loss at this time was 9% and good.

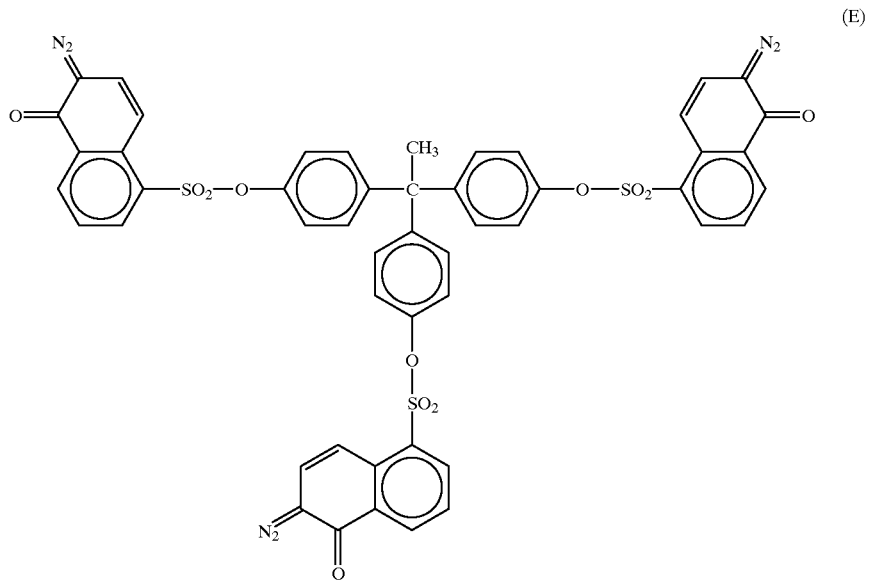

(E)

EXAMPLES 5 and 6

The evaluation of photosensitivity was conducted in the same manner as in Example 1, except that the amount of dodecyl-benzenesulfonic acid was changed to 0.1% by weight and 10% by weight, respectively.

COMPARATIVE EXAMPLE 1

The same evaluation as in Example 1 was conducted, except that the developer was replaced by a developer consisting of 1.20 parts by weight of tetramethylammonium hydroxide and 98.80 parts by weight of pure water and not containing the dodecylbenzenesulfonic acid.

COMPARATIVE EXAMPLE 2

The same evaluation as in Example 2 was conducted, except that the developer was replaced by a developer consisting of 2.00 parts by weight of tetramethylammonium hydroxide and 98.00 parts by weight of pure water and not containing the dodecylbenzenesulfonic acid.

COMPARATIVE EXAMPLE 3

The same evaluation as in Example 1 was conducted, except that the developer was replaced by a developer consisting of 1.20 parts by weight of tetramethylammonium hydroxide, 86.80 parts by weight of pure water and 12.00 parts by weight of dodecylbenzenesulfonic acid.

COMPARATIVE EXAMPLE 4

The same evaluation as in Example 1 was conducted, except that the developer was replaced by a developer consisting of 1.20 parts by weight of tetramethylammonium hydroxide, 98.75 parts by weight of pure water and 0.05 part by weight of dodecylbenzenesulfonic acid.

COMPARATIVE EXAMPLE 5

The same evaluation as in Example 1 was conducted, except that the developer was replaced by a developer consisting of 1.20 parts by weight of tetramethylammonium hydroxide, 98.30 parts by weight of pure water and 0.50 part by weight of sodium dodecylbenzenesulfonate.

The results obtained in the Examples and the Comparative Examples are shown in Table 1.

TABLE 1

|   | Alkali-soluble Polymer | Photo-Sensitive Agent | Surfactant | Scum after Development | Resolution ($\mu$m) | Film thickness loss (%) | Na (ppm) |
|---|---|---|---|---|---|---|---|
| 1 | A | D | F 0.5 wt. % | No | 2.5 | 10 | <0.01 |
| 2 | B | D | F 5.0 wt % | No | 5 | 8 | <0.01 |
| 3 | A/C = 50/50 | D | F 0.3 wt % | No | 2 | 13 | <0.01 |
| 4 | A | E | F 0.5 wt % | No | 3 | 9 | <0.01 |
| 5 | A | D | F 0.1 wt % | No | 2.5 | 9 | <0.01 |
| 6 | A | D | F 10 wt % | No | 5 | 11 | <0.01 |
| 1 | A | D | — | Yes | 10 | 9 | <0.01 |
| 2 | B | E | — | Yes | 15 | 7 | <0.01 |
| 3 | A | D | F 12 wt. % | No | 5 | 47 | <0.015 |

TABLE 1-continued

| | Alkali-soluble Polymer | Photo-Sensitive Agent | Surfactant | Scum after Development | Resolution ($\mu$m) | Film thickness loss (%) | Na (ppm) |
|---|---|---|---|---|---|---|---|
| 4 | A | D | F 0.05 wt % | Yes | 12 | 10 | <10 |
| 5 | A | D | G 0.5 wt % | No | 5 | 9 | 430 |

NOTE:
Surfactant:
F: Dodecylbenzenesulfonic acid
G: Na-dodecylbenzenesulfonate
Na: The amount of Na in resultant product determined by ion-chromatography The foregoing description of the specific embodiments will so fully reveal the general nature of the invention that others can, by applying current knowledge, readily modify and/or adapt for various applications such specific embodiments without undue experimentation and without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. The means, materials, and steps for carrying out various disclosed functions may take a variety of alternative forms without departing from the invention.

Thus the expressions "means to . . . " and "means for . . . ", or any method step language, as may be found in the specification above and/or in the claims below, followed by a functional statement, are intended to define and cover whatever structural, physical, chemical or electrical element or structure, or whatever method step, which may now or in the future exist which carries out the recited function, whether or not precisely equivalent to the embodiment or embodiments disclosed in the specification above, i.e., other means or steps for carrying out the same function can be used; and it is intended that such expressions be given their broadest interpretation.

What is claimed is:

1. A method for the pattern-processing of a photosensitive resin composition for use in a semiconductor wafer coating, which comprises coating on a substrate a positive photosensitive resin composition consisting essentially of a polyamide represented by the following formula (1) and a diazoquinone compound:

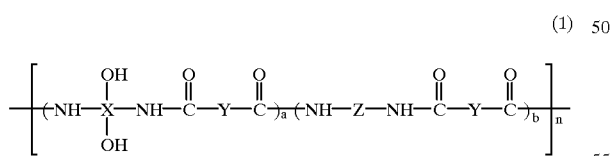

(1)

wherein X is a tetravalent aromatic group; Y is a divalent aromatic group; Z is

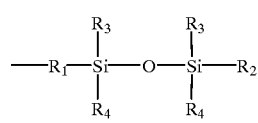

in which $R_1$ and $R_2$ are divalent organic groups and $R_3$ and $R_4$ are monovalent organic groups; a and b represent mole fractions; a+b=100%; a=60–95 mole %; b=5–40 mole % and n=2–500, subjecting the same to prebaking and then to irradiation with a light, thereafter dissolving the exposed portion in an organic alkaline aqueous solution containing an alkyl-benzenesulfonic acid to remove the same, thereby obtaining a pattern.

2. The pattern-processing method according to claim 1, wherein the alkylbenzenesulfonic acid is dodecylbenzenesulfonic acid.

3. The pattern-processing method according to claim 1, wherein the amount of the alkylbenzenesulfonic acid contained in the organic alkaline aqueous solution is 0.1–10% by weight based on the total weight of the organic alkaline aqueous solution.

4. The pattern-processing method according to claim 1, wherein the organic alkaline aqueous solution is an aqueous solution of ethylamine, n-propylamine, diethylamine, di-n-propylamine, triethylamine, methyldiethylamine, dimethylethanolamine, triethanolamine or tetraethylammonium hydroxide.

5. The pattern-processing method according to claim 4, wherein the organic alkaline aqueous solution is an aqueous solution of tetraethylammonium hydroxide.

6. The pattern-processing method according to claim 1, wherein X in the formula (1) representing a polyamide is a group represented by one of the following structural formulas:

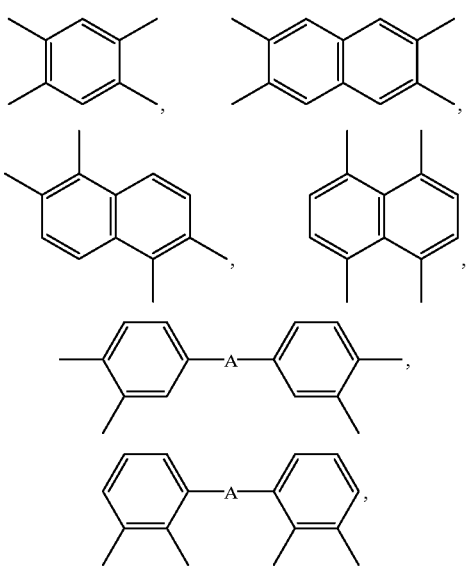

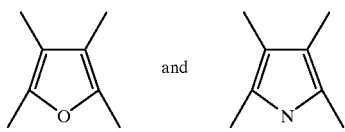

wherein A represents —CH$_2$—, —O—, —S—, —SO$_2$—CO—, —NHCO— or —C(CF$_3$)$_2$—.

7. The pattern-processing method according to claim 1, wherein Y in the formula (1) representing a polyamide is a group represented by one of the following structural formulas:

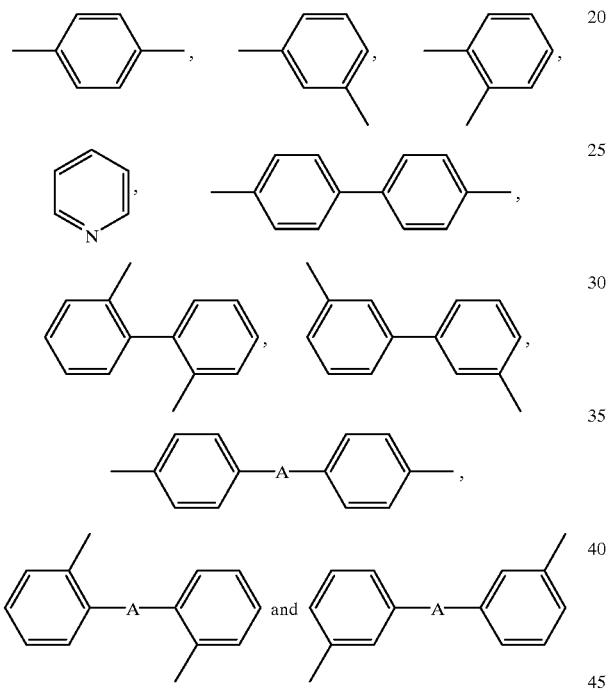

wherein A represents —CH$_2$—, —O—, —S—, —SO$_2$—, —CO—, —NHCO— or —C(CF$_3$)$_2$—.

8. The pattern-processing method according to claim 1, wherein Z in the formula (1) representing a polyamide is a group represented by one of the following structural formulas:

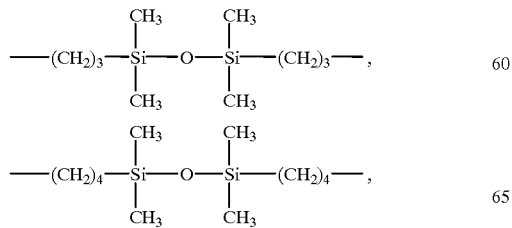

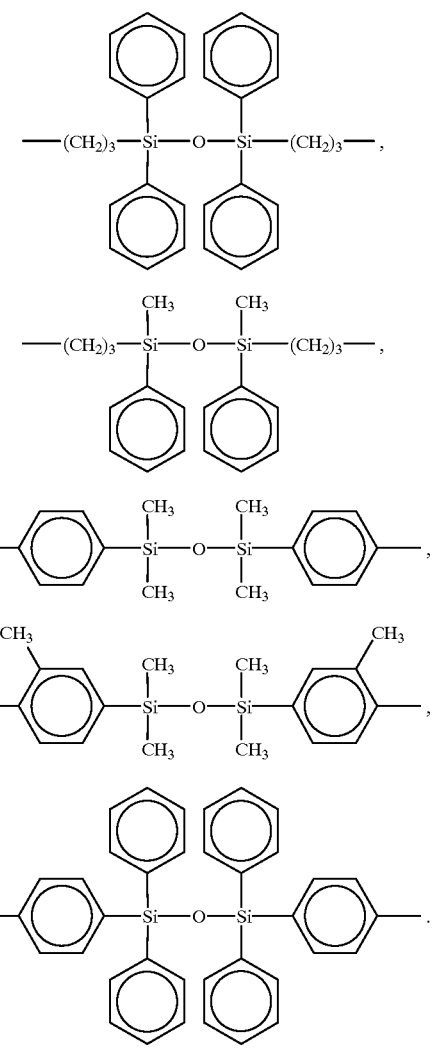

9. The pattern-processing method according to claim 1, wherein the diazoquinone compound is a compound represented by one of the following structural formulas:

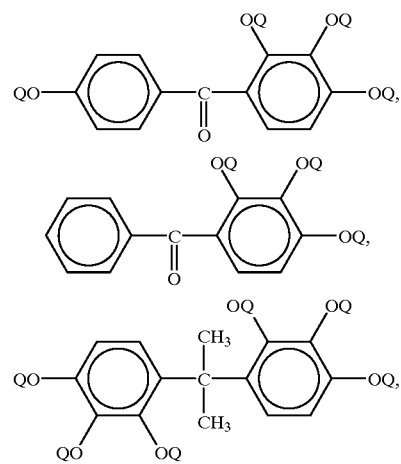

-continued
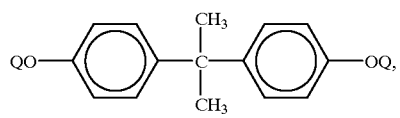
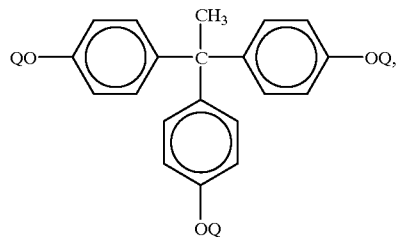
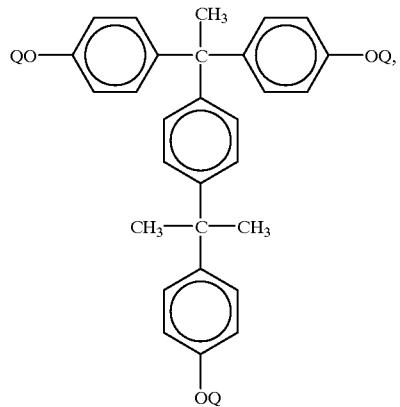
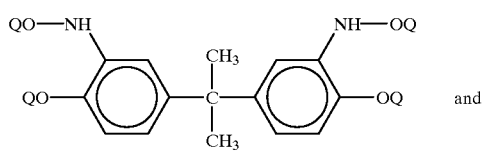 and
-continued
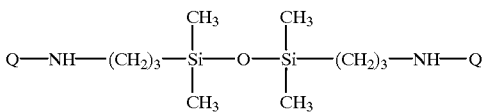
wherein Q is a hydrogen atom
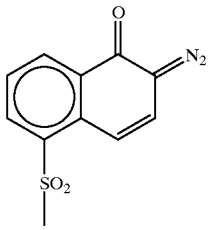 or 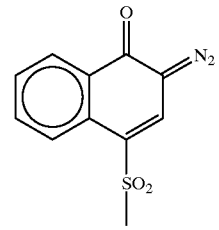
and at least one Q in each of the above compounds is
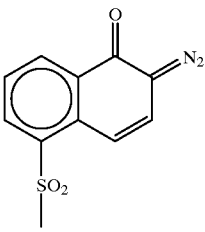 or 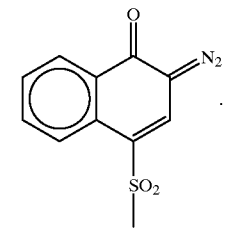.
10. The pattern-processing method according to claim 1, wherein the polyamide has any one of the following structural formulas:
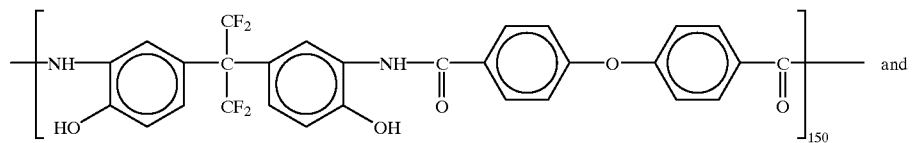 and
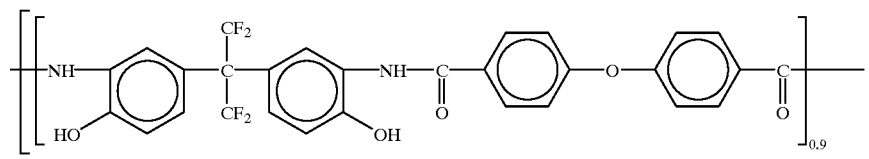
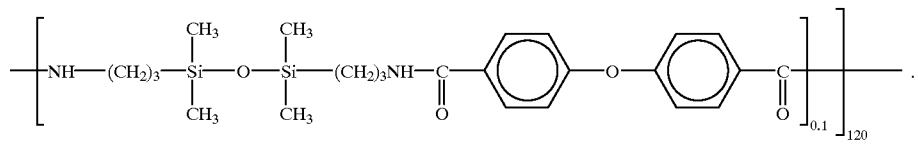.

11. The pattern-processing method according to claim 1, wherein the diazoquinone compound has any one of the following structural formulas:
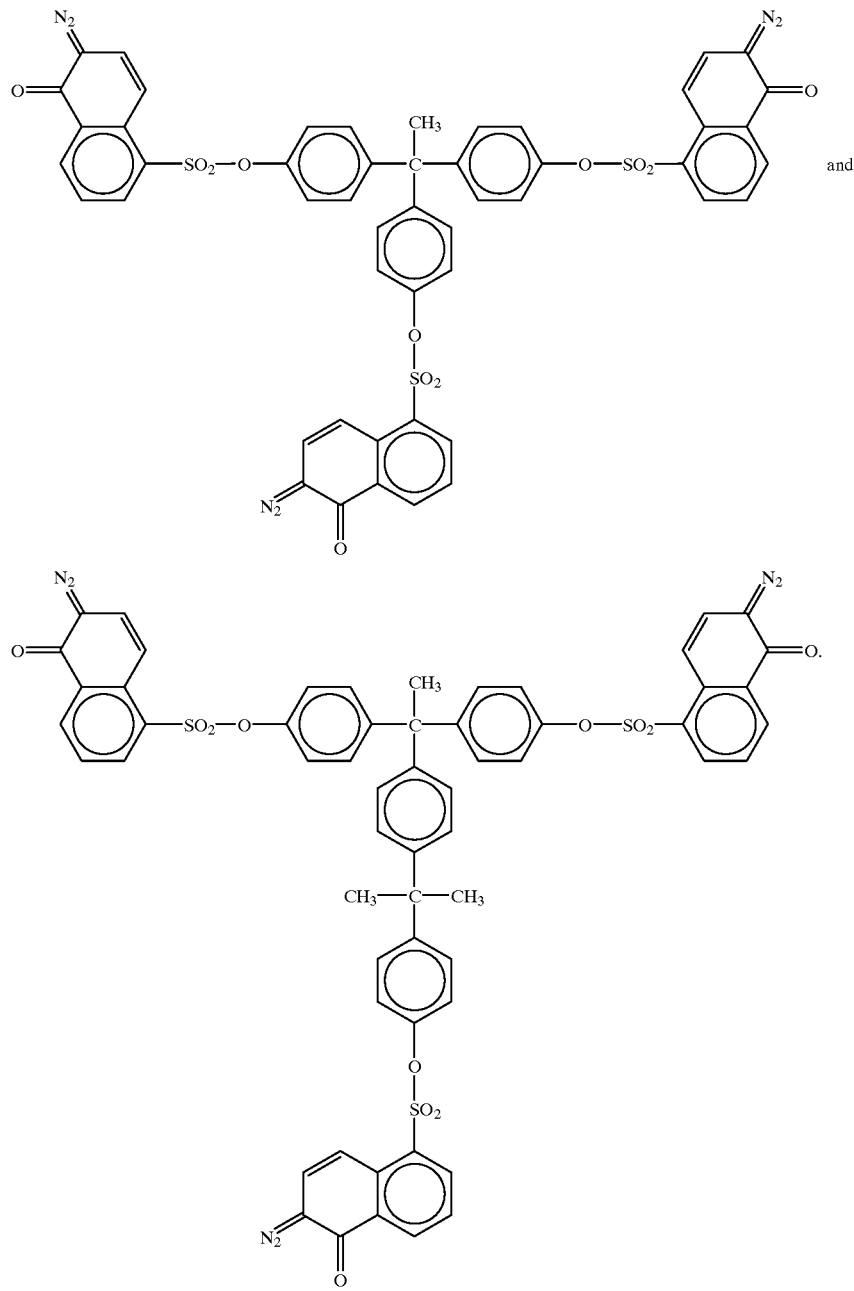
and
12. The pattern-processing method according to claim 1, wherein the content of metal ion in the entire alkaline aqueous solution is 0.001 to 1 ppm.
13. The pattern producing method according to claim 6 wherein A is —$CH_2$—, —O—, —S—, —$SO_2$—, —CO— or —NHCO—.
* * * * *